United States Patent
Shim et al.

(10) Patent No.: US 10,913,849 B2
(45) Date of Patent: Feb. 9, 2021

(54) RESIN COMPOSITION FOR SEMICONDUCTOR PACKAGE, AND PREPREG AND METAL CLAD LAMINATE USING THE SAME

(71) Applicant: LG CHEM, LTD., Seoul (KR)

(72) Inventors: Chang Bo Shim, Daejeon (KR); Hee Yong Shim, Daejeon (KR); Hyun Sung Min, Daejeon (KR); Hwa Yeon Moon, Daejeon (KR); Seung Hyun Song, Daejeon (KR); Yong Seon Hwang, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

(21) Appl. No.: 16/487,047

(22) PCT Filed: Apr. 11, 2018

(86) PCT No.: PCT/KR2018/004248
§ 371 (c)(1),
(2) Date: Aug. 19, 2019

(87) PCT Pub. No.: WO2018/212459
PCT Pub. Date: Nov. 22, 2018

(65) Prior Publication Data
US 2020/0231804 A1    Jul. 23, 2020

(30) Foreign Application Priority Data
May 15, 2017 (KR) .......... 10-2017-0060152

(51) Int. Cl.
| | |
|---|---|
| *C08L 71/12* | (2006.01) |
| *C08J 5/24* | (2006.01) |
| *C08L 9/06* | (2006.01) |
| *C08L 23/20* | (2006.01) |
| *C08L 83/04* | (2006.01) |
| *C08K 3/013* | (2018.01) |
| *C08K 5/08* | (2006.01) |

(52) U.S. Cl.
CPC .............. *C08L 71/12* (2013.01); *C08J 5/24* (2013.01); *C08L 9/06* (2013.01); *C08L 23/20* (2013.01); *C08L 83/04* (2013.01); *C08J 2309/06* (2013.01); *C08J 2323/20* (2013.01); *C08J 2371/10* (2013.01); *C08K 3/013* (2018.01); *C08K 5/08* (2013.01); *C08L 2203/20* (2013.01)

(58) Field of Classification Search
CPC ........ C08L 71/12; C08L 71/126; C08L 23/20; C08L 9/06; C08J 5/24; C08F 136/06; C08F 236/10; C08F 297/04; C08F 222/40; C08K 5/08; B32B 15/08
See application file for complete search history.

(56) References Cited

U.S. PATENT DOCUMENTS

| | | | |
|---|---|---|---|
| 8,115,105 | B2 | 2/2012 | Amou et al. |
| 9,428,646 | B2 | 8/2016 | Hsieh |
| 2006/0099458 | A1 | 5/2006 | Hanson et al. |
| 2008/0171817 | A1 | 7/2008 | Peters et al. |
| 2008/0300350 | A1* | 12/2008 | Ohno ............ C08F 283/06 524/147 |
| 2012/0199992 | A1 | 8/2012 | Tabei |
| 2014/0370771 | A1 | 12/2014 | Oka et al. |
| 2015/0313012 | A1 | 10/2015 | Chen et al. |
| 2016/0219700 | A1 | 7/2016 | Hamajima et al. |
| 2016/0244610 | A1 | 8/2016 | Chen et al. |
| 2017/0002192 | A1 | 1/2017 | Chung et al. |
| 2019/0300639 | A1 | 10/2019 | Kitai et al. |

FOREIGN PATENT DOCUMENTS

| | | |
|---|---|---|
| JP | 2003012820 A | 1/2003 |
| JP | 2003064239 A | 3/2003 |
| JP | 2007-191681 A | 8/2007 |
| JP | 2009-167268 A | 7/2009 |
| JP | 2010-111758 A | 5/2010 |
| JP | 2018-95815 A | 6/2018 |
| KR | 1020090078750 A | 7/2009 |
| KR | 1020090106397 A | 10/2009 |
| KR | 1020150089063 A | 8/2015 |
| KR | 1020160107309 A | 9/2016 |
| KR | 1020160128463 A | 11/2016 |
| KR | 1020170005352 A | 1/2017 |
| WO | 2001040354 A1 | 7/2001 |
| WO | 2013/047041 A1 | 4/2013 |
| WO | 2014/203511 A1 | 12/2014 |
| WO | 2015033731 A1 | 3/2017 |

* cited by examiner

*Primary Examiner* — Kuo Liang Peng
(74) *Attorney, Agent, or Firm* — Dentons US LLP

(57) ABSTRACT

A resin composition, optionally for a semiconductor package, and a prepreg and a metal clad laminate using the same are provided. The resin composition according to the present invention may exhibit excellent flowability although being packed with a high content of an inorganic filler, and may provide a prepreg and a metal clad laminate having excellent adhesive strength for a metal foil, and low relative permittivity and a low dissipation factor.

13 Claims, No Drawings

RESIN COMPOSITION FOR SEMICONDUCTOR PACKAGE, AND PREPREG AND METAL CLAD LAMINATE USING THE SAME

The present application is a National Phase entry pursuant to 35 U.S.C. § 371 of International Application No. PCT/KR2018/004248 filed Apr. 11, 2018, and claims priority to and the benefit of Korean Patent Application No. 10-2017-0060152, filed on May 15, 2017, the disclosures of which are hereby incorporated by reference herein in their entirety.

FIELD

The present invention relates to a resin composition for a semiconductor package, and a prepreg and a metal clad laminate using the same.

BACKGROUND

A copper clad laminate (CCL) used in a printed circuit board (PCB) is manufactured by impregnating a glass fabric substrate with a thermosetting resin varnish, semi-curing the substrate to form a prepreg, and then pressurizing and heating the prepreg together with a copper foil. The prepreg is used again for configuring and building up a circuit pattern on this copper clad laminate.

In recent years, as high performance, slimness, and lightness of electronic devices, communication devices, smart phones, etc. have been accelerated. Thus, slimness of semiconductor packages has also been required. Therefore, there is a growing need for slimness of printed circuit boards for semiconductor packages.

However, during the slimming process, a problem of reduced rigidity of the printed circuit board is generated, and at the same time, a warpage phenomenon of the semiconductor package occurs due to a difference in coefficient of thermal expansion between a chip and the printed circuit board. This warpage phenomenon is further increased by a phenomenon that the printed circuit board is not restored to its original state through a high temperature process such as reflow.

Accordingly, in order to improve this warpage phenomenon, studies are being conducted on technologies for reducing the coefficient of thermal expansion of the substrate. For example, a technology of packing the prepreg with a high content of an inorganic filler has been proposed. However, there is a limitation in that flowability of the prepreg is drastically reduced when the prepreg is simply packed with a high content of the inorganic filler.

Accordingly, there is a need to develop a prepreg and a metal clad laminate which may realize a low coefficient of thermal expansion while securing flowability of the prepreg under a high temperature process.

SUMMARY

The present invention provides a resin composition for a semiconductor package showing characteristics of low permittivity, low dissipation factor, and low thermal expansion while having excellent adhesive strength for a metal foil and high flowability although a high content of an inorganic filler is packed.

The present invention provides a prepreg obtained by using the resin composition of the semiconductor package.

Further, the present invention provides a metal clad laminate including the prepreg.

According to the present invention, a resin composition for a semiconductor package is provided, including:

(a) a modified phenylene ether oligomer or a modified poly(phenylene ether) having ethylenically unsaturated groups at both ends thereof;

(b) one or more compounds selected from the group consisting of polybutadiene having 1,2-vinyl groups in a molecule, a styrene-butadiene copolymer, a bismaleimide resin, and a cyanate ester resin;

(c) a quinone compound;

(d) an alkoxysilane oligomer; and (e) an inorganic filler.

Further, according to the present invention, a prepreg obtained by impregnating a fabric substrate with the resin composition for the semiconductor package is provided.

Furthermore, according to the present invention, a metal clad laminate including a metal foil which is integrated with the prepreg by heating and pressurizing is provided.

DETAILED DESCRIPTION

Hereinafter, a resin composition for a semiconductor package, and a prepreg and a metal clad laminate using the same, according to embodiments of the present invention will be described in detail.

The terminology used herein is for the purpose of describing particular embodiments only and is not intended to be limiting of the invention, unless the context clearly indicates otherwise.

The singular form used herein includes the plural form unless that is contradictory to the concept of the invention.

The term "including", as used herein, specifies the presence of stated features, regions, integers, steps, operations, elements, and/or components, but does not preclude the presence or addition of other stated features, regions, integers, steps, operations, elements, components, and/or groups thereof.

I. Resin Composition for Semiconductor Package

According to one embodiment of the present invention, a resin composition for a semiconductor package is provided, including:

(a) a modified phenylene ether oligomer or a modified poly(phenylene ether) having ethylenically unsaturated groups at both ends thereof;

(b) one or more compounds selected from the group consisting of polybutadiene having 1,2-vinyl groups in a molecule, a styrene-butadiene copolymer, a bismaleimide resin, and a cyanate ester resin;

(c) a quinone compound;

(d) an alkoxysilane oligomer; and (e) an inorganic filler.

As a result of continuous study by the present inventors, it was confirmed that when the resin composition for the semiconductor package including the components (a) to (e) is used, the (c) quinone compound allows radical polymerization to slowly occur, thereby increasing resin flow of a prepreg, and it is possible to provide the prepreg having excellent flowability while being packed with a high content of the (e) inorganic filler.

It was also confirmed that as the resin composition for the semiconductor package includes the (d) alkoxysilane oligomer, excellent adhesive strength for a metal foil may be achieved while preventing a reduction of heat resistance or an increase of permittivity.

The resin composition for the semiconductor package makes it possible to provide a prepreg having excellent adhesive strength for a metal foil while having low relative permittivity and a low dissipation factor, and a metal clad laminate including the prepreg.

Hereinafter, the components to be included in the resin composition for the semiconductor package will be described in more detail.

The resin composition for the semiconductor package includes the (a) modified phenylene ether oligomer or modified poly(phenylene ether) having ethylenically unsaturated groups at both ends thereof.

The component (a) is a phenylene ether oligomer or a poly(phenylene ether) of which both ends are functionalized with ethylenically unsaturated groups.

The ethylenically unsaturated group may include: alkenyl groups such as an ethenyl group, an allyl group, a methallyl group, a propenyl group, a butenyl group, a hexenyl group, an octenyl group, etc.; cycloalkenyl groups such as a cyclopentenyl group, a cyclohexenyl group, etc.; an acryl group; a methacryl group; and alkenylaryl groups such as a vinylbenzyl group, a vinylnaphthyl group, etc.

The two ethylenically unsaturated groups at both ends of the component (a) may be the same as or different from each other.

A preparation method of the component (a) is not particularly limited. For example, those functionalized with vinylbenzyl groups may be prepared by dissolving a bifunctional phenylene ether oligomer and vinylbenzene chloride in a solvent, reacting them with addition of a base under heating and stirring, and then solidifying a resin.

A number average molecular weight of the component (a) may preferably be 500 g/mol to 3000 g/mol, and more preferably 1000 g/mol to 2500 g/mol, when converted into polystyrene by a GPC method. The number average molecular weight of the component (a) may preferably be 500 g/mol or more, in order to prevent the prepreg formed by using the resin composition from sticking well. The number average molecular weight of the component (a) may preferably be 300 g/mol or less, in order to secure solubility for the solvent.

The resin composition for the semiconductor package includes (b) one or more compounds selected from the group consisting of polybutadiene having 1,2-vinyl groups in a molecule, a styrene-butadiene copolymer, a bismaleimide resin, and a cyanate ester resin.

The component (b) is used as a binder resin, together with the above-described component (a).

The polybutadiene is preferably a liquid at room temperature. The liquid polybutadiene may have a molecular weight of more than 50,000, but preferably a molecular weight of less than 5000 (more preferably, a molecular weight of 1000 to 3000).

The liquid polybutadiene maintains viscosity of the composition at a manageable level during processing at room temperature, and forms a crosslinking bond during curing. Polybutadiene having at least 20% by weight of 1,2-vinyl groups may be preferred in order to achieve a maximum crosslinking density at the time of curing due to a large number of pendant vinyl groups available for the crosslinking bond. The high crosslinking density allows an electronic circuit board to exhibit excellent high temperature properties.

The styrene-butadiene copolymer is a liquid at room temperature, and its styrene content is preferably about 5% to about 50%. Further, the styrene-butadiene copolymer may preferably have a glass transition temperature (Tg) of −35° C. to 0° C., or −30° C. to −5° C., and a number average molecular weight of 1000 g/mol to 50,000 g/mol, or 2000 g/mol to 10,000 g/mol.

As the bismaleimide resin and the cyanate ester resin, any one that is well known in the art to which the present invention pertains may be used without particular limitation, respectively.

For example, the bismaleimide resin may be one or more compounds selected from the group consisting of diphenylmethane-type bismaleimides such as 4,4'-diphenylmethane bismaleimide, phenylene-type bismaleimides such as an oligomer of phenylmethane maleimide, m-phenylene bismaleimide, bisphenol A diphenyl ether bismaleimide, 3,3'-dimethyl-5,5'-diethyl-4,4'-diphenylmethane bismaleimide, 4-methyl-1,3-phenylene bismaleimide, and 1,6-bismaleimide-(2,2,4-trimethyl)hexane.

For example, the cyanate ester resin may be one or more compounds selected from the group consisting of novolactype cyanate resins, dicyclopentadiene-type cyanate resins, bisphenol-type cyanate resins, and partially-triazinated prepolymers thereof.

According to one embodiment of the present invention, the resin composition for the semiconductor package may include the polybutadiene having 1,2-vinyl groups in the molecule and the styrene-butadiene copolymer as the component (b).

According to another embodiment of the present invention, the resin composition for the semiconductor package may include the styrene-butadiene copolymer, the bismaleimide resin, and the cyanate ester resin as the component (b).

According to still another embodiment of the present invention, the resin composition for the semiconductor package may include the polybutadiene having 1,2-vinyl groups in the molecule, the styrene-butadiene copolymer, the bismaleimide resin, and the cyanate ester resin as the component (b).

A content of the component (b) may be 10 parts by weight to 100 parts by weight, or 20 parts by weight to 100 parts by weight with respect to 100 parts by weight of the component (a). Specifically, the component (b) may be included in an amount of 20 parts by weight or more, 25 parts by weight or more, or 30 parts by weight or more, and 100 parts by weight or less, 90 parts by weight or less, or 80 parts by weight, with respect to 100 parts by weight of the component (a).

As a non-limiting example, of the components (b), the polybutadiene may be included in an amount of 5 parts by weight to 40 parts by weight or 10 parts by weight to 30 parts by weight; the styrene-butadiene copolymer may be included in an amount of 5 parts by weight to 40 parts by weight or 10 parts by weight to 30 parts by weight; the bismaleimide resin may be included in an amount of 5 parts by weight to 100 parts by weight or 10 parts by weight to 90 parts by weight; and the cyanate ester resin may be included in an amount of 5 parts by weight to 100 parts by weight or 10 parts by weight to 90 parts by weight, with respect to 100 parts by weight of the component (a).

The resin composition for the semiconductor package includes the (c) quinone compound.

The component (c) acts as a radical polymerization retarder in the resin composition for the semiconductor package. The component (c) allows the radical polymerization of the resin composition for the semiconductor package to slowly occur, and therefore, it is possible to provide a prepreg having high resin flow. As a result, it is possible to provide a prepreg and a metal clad laminate having excellent flowability, a low dieletric constant, and a low coefficient of thermal expansion while being packed with a high content of an inorganic filler.

The component (c) may preferably be one or more selected from the group consisting of 1,4-naphthoquinone and 1,4-benzoquinone.

A content of the component (c) may be 1 part by weight to 20 parts by weight with respect to 100 parts by weight of the component (a). Specifically, the component (c) may be included in an amount of 1 part by weight or more, 2 parts by weight or more, 3 parts by weight or more, or 4 parts by weight or more, and 20 parts by weight or less, 15 parts by weight or less, or 10 parts by weight, with respect to 100 parts by weight of the component (a).

The content of the component (c) may preferably be 1 part by weight or more in order to obtain the sufficient retarding effect of radical polymerization. However, if an excess amount of the component (c) is added, efficiency of the radical polymerization may be rapidly reduced. Therefore, the component (c) may preferably be included in an amount of 20 parts by weight or less.

The resin composition for the semiconductor package includes the (d) alkoxysilane oligomer.

The component (d) allows the prepreg formed by using the resin composition for the semiconductor package to exhibit excellent adhesive strength for a metal foil.

In general, a monomer-type coupling agent is added in order to improve adhesive strength for the metal foil during manufacture of the metal clad laminate or the prepreg. However, if a large amount of the monomer-type coupling agent is added in order to achieve the above purpose, a low boiling point of the coupling agent may generate problems such as delamination between the metal foil and the prepreg, reduced heat resistance, and increased permittivity.

Even if the component (d) as an oligomer of an alkoxysilane skeleton is added in a large amount, it is possible to provide the prepreg having excellent adhesive strength for the metal foil while preventing the reduction of heat resistance or the increase of permittivity.

Preferably, the component (d) may be an oligomer including a repeating unit represented by the following Chemical Formula 1.

[Chemical Formula 1]

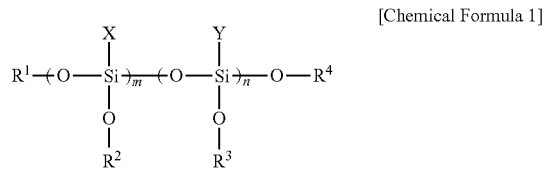

In Chemical Formula 1, X and Y are each independently alkenyl, methacryl, acryl, phenyl, methyl, or epoxy, $R^1$ to $R^4$ are each independently methyl or ethyl, and m and n are each independently an integer of 1 or more.

Specifically, the component (d) may be one or more compounds selected from the group consisting of a methoxy functional vinyl siloxane oligomer, an ethoxy functional vinyl siloxane oligomer, and a methoxy functional vinyl/phenyl oligomer.

A content of the component (d) may be 10 parts by weight to 100 parts by weight with respect to 100 parts by weight of the component (a). Specifically, the component (d) may be included in an amount of 10 parts by weight or more, 15 parts by weight or more, or 20 parts by weight or more, and 100 parts by weight or less, 90 parts by weight or less, 80 parts by weight or less, or 70 parts by weight or less, with respect to 100 parts by weight of the component (a).

The content of the component (d) may preferably be 10 parts by weight or more to sufficiently obtain the above-described effect. However, if an excess amount of the component (d) is added, problems of increased relative permittivity and dissipation factor may be generated. Therefore, the component (c) may preferably be included in an amount of 100 parts by weight or less.

The resin composition for the semiconductor package includes the (e) inorganic filler.

As the inorganic filler, any one that is well known in the art to which the present invention pertains may be used without particular limitation. For example, the inorganic filler may be one or more compounds selected from the group consisting of silica, aluminum trihydroxide, magnesium hydroxide, molybdenum oxide, zinc molybdate, zinc borate, zinc stannate, alumina, clay, kaolin, talc, calcined kaolin, calcined talc, mica, short glass fiber, fine glass powder, and hollow glass.

A content of the inorganic filler may be 200 parts by weight to 1000 parts by weight with respect to 100 parts by weight of the component (a). Specifically, the inorganic filler may be included in an amount of 200 parts by weight or more, 250 parts by weight or more, 300 parts by weight or more, or 350 parts by weight or more, and 1000 parts by weight or less, 950 parts by weight or less, 900 parts by weight or less, 850 parts by weight or less, or 800 parts by weight or less, with respect to 100 parts by weight of the component (a).

The content of the inorganic filler may preferably be 200 parts by weight or more in order to prevent an increase of a warpage phenomenon during a reflow process and to secure rigidity of the metal clad laminate. However, if an excess amount of the inorganic filler is added, flowability of the prepreg may be rapidly reduced, and therefore the inorganic filler may preferably be included in an amount of 1000 parts by weight or less.

An average particle size of the inorganic filler may preferably be 0.1 μm to 100 μm. Further, a mixture of nano-scale small particles and micro-scale large particles is preferably used as the inorganic filler to increase the packing density.

As needed, a metal-coordination catalyst for progression of the radical polymerization may be further added to the resin composition for the semiconductor package.

In addition, a non-polar free radical generator may be further included in the resin composition for the semiconductor package.

When a general peroxide-type radical initiator is used, a radical reaction rate is fast, and therefore it is difficult to secure flowability of the prepreg upon being packed with a high content of the inorganic filler.

In contrast, when the non-polar free radical generator is used, a reaction rate is slow due to a high radical initiation temperature. Therefore, the polymerization reaction may be controlled to proceed slowly, and the prepreg having high resin flow may be provided.

The non-polar free radical generator may be one or more compounds selected from the group consisting of 2,3-dimethyl-2,3-diphenylbutane, 3,4-dimethyl-3,4-diphenylhexane, 4,5-dimethyl-4,5-diphenyloctane, 3,4-diethyl-3,4-diphenylhexane, 4,5-diethyl-4,5-diphenyloctane, 2,3-dimethyl-2,3-di-p-tolylbutane, and 3,4-dimethyl-3,4-di-p-tolylhexane.

The resin composition for the semiconductor package may be used in a solution prepared by adding a solvent thereto.

The solvent is not particularly limited, as long as it has good solubility for the resin composition for the semiconductor package. For example, the solvent may be acetone, methyl ethyl ketone, methyl isobutyl ketone, cyclohexanone, ketone, benzene, toluene, xylene, dimethylformamide, dimethylacetamide, methyl cellosolve, butyl cellosolve, etc.

The resin composition for the semiconductor package may further include a thermosetting resin, a thermoplastic resin, an elastomer, a flame retardant compound, an ultraviolet absorber, an antioxidant, a photopolymerization initiator, a fluorescent brightening agent, a photosensitizer, a pigment, a dye, a thickener, a lubricant, a defoaming agent, a dispersing agent, a leveling agent, a polishing agent, etc. within the scope that does not impair inherent properties of the resin composition.

II. Prepreg

According to another embodiment of the present invention, a prepreg obtained by impregnating a fabric substrate with the above-described resin composition for the semiconductor package is provided.

The prepreg refers to a material in which the resin composition for the semiconductor package is impregnated into the fabric substrate in a semi-cured state.

A kind of fabric constituting the fabric substrate is not particularly limited.

For example, the fabric substrate may be a synthetic fabric substrate made of, as a main ingredient, a glass fabric, a polyamide resin fabric, an aromatic polyamide resin fabric, a polyester resin fabric, an aromatic polyester resin fabric, a polyimide resin fabric, a polybenzoxazole fabric, a fluorine resin fabric, etc.

In addition to the above fabric substrates, a paper substrate made of, as a main ingredient, kraft paper, cotton linter paper, or a mixed paper of linter and kraft pulp may be used.

Preferably, a glass fabric substrate may be used as the fabric substrate. The glass fabric substrate may improve strength of the prepreg, may reduce absorption, and may lower the coefficient of thermal expansion.

A variety of materials used for printed circuit boards may be applied to the glass substrate. For example, E glass, D glass, S glass, T glass, NE glass, L glass, or Q glass may be applied to the material for the glass substrate.

The fabric substrate may be in various forms of woven fabric, non-woven fabric, roving, chopped strand mat, surfacing mat, etc.

A thickness of the fabric substrate is not particularly limited, but is preferably about 0.01 mm to 0.5 mm.

The prepreg may be produced by a method that is well known in the art to which the present invention pertains.

For example, the prepreg may be produced by an impregnation method, a coating method using any of various coaters, a spraying method using a sprayer, etc.

For example, when the impregnation method is used, a varnish including the resin composition for the semiconductor package is prepared, and then the fabric substrate is impregnated with the varnish, followed by drying.

The solvent used in the preparation of the varnish is not particularly limited, as long as it has good solubility for the resin composition for the semiconductor package. For example, the solvent may be acetone, methyl ethyl ketone, methyl isobutyl ketone, cyclohexanone, ketone, benzene, toluene, xylene, dimethylformamide, dimethylacetamide, methyl cellosolve, butyl cellosolve, etc.

At the time of producing the prepreg, the drying may be performed at a temperature of 80° C. to 200° C., and a drying time may be controlled depending on a gelation state of the varnish.

The prepreg obtained after drying may be in a state in which the resin content of the varnish is about 30% by weight to about 80% by weight, based on the total weight.

III. Metal Clad Laminate

According to still another embodiment of the present invention, a metal clad laminate including the prepreg and a metal foil which is integrated with the prepreg by heating and pressurizing is provided.

The metal foil may be a copper foil; an aluminum foil; a composite foil with a three-layer structure including nickel, nickel-phosphorus, a nickel-tin alloy, a nickel-iron alloy, lead, or a lead-tin alloy as an interlayer between copper layers having different thicknesses on either side; or a composite foil with a two-layer structure including aluminum and copper foils.

Preferably, the metal foil may be a copper foil or an aluminum foil.

A thickness of the metal foil may be about 2 μm to about 200 μm, preferably about 2 μm to about 100 μm, and more preferably about 2 μm to about 35 μm.

The metal foil may be a composite foil with a three-layer structure including nickel, nickel-phosphorus, a nickel-tin alloy, a nickel-iron alloy, lead, or a lead-tin alloy as the interlayer between a 0.5 μm to 15 μm copper layer and a 10 μm to 300 μm copper layer on either side, or a composite foil with a two-layer structure including aluminum and copper foils.

The metal clad laminate may be manufactured by laminating the metal foil on the prepreg in a semi-cured state, and integrating them by heating and pressurizing. Further, one or more metal clad laminate may be laminated and used in the manufacture of a double-sided or multilayer printed circuit board.

The double-sided or multilayer printed circuit board may be manufactured by processing a circuit on the metal clad laminate, and the circuit may be processed by a method performed in a general manufacturing process of a double-sided or multilayer printed circuit board.

A resin composition for a semiconductor package according to the present invention may exhibit excellent flowability although being packed with a high content of an inorganic filler, and may provide a prepreg and a metal clad laminate having excellent adhesive strength for a metal foil, and low relative permittivity and a low dissipation factor.

EXAMPLES

Hereinafter, preferred examples will be provided for better understanding of the present invention. However, the following examples are for illustrative purposes only, and the present invention is not intended to be limited thereto.

Examples and Comparative Examples (1) Preparation of Resin Composition for Semiconductor Package According to compositions (contents in parts by weight based on 100 parts by weight of (a1) component, (a2) component, or (a3) component) of the following Tables 1 to 3, each component was added to and mixed with cyclohexanone at a solid content of 65% by weight, and then stirred at room temperature at a speed of 400 rpm for one day to prepare each resin composition (resin varnish) for a semiconductor package of the examples and comparative examples.

(2) Preparation of Prepreg

The prepared resin varnish was impregnated into a glass fiber having a thickness of 15 μm (manufactured by Nittobo, T-glass #1017), and then dried with hot air at 130° C. for 3 minutes to produce a prepreg having a thickness of 25 μm (resin content: 70% by weight).

(3) Preparation of Metal Clad Laminate

Two of the produced prepregs were laminated, and copper foils (thickness of 12 μm, manufactured by Mitsui) were placed and laminated on both sides thereof. The laminate was cured for 140 minutes at 230° C. under a pressure of 35 kg/cm² to manufacture a copper clad laminate.

TABLE 1

| Component | | Example 1 | Example 2 | Example 3 |
|---|---|---|---|---|
| (a1) | OPE-2St-1200 | — | 100 | — |
| (a2) | OPE-2St-2200 | 100 | — | — |
| (a3) | SA-9000 | — | — | 100 |
| (b1) | B3000 | 10 | 15.4 | — |
| (b2) | Ricon100 | 10 | 15.4 | 11.1 |
| (b3) | BMI-5100 | 20 | — | 22.2 |
| (b4) | NZ-375 | 40 | — | 55.6 |
| (c) | QS-10 | 10 | 4.6 | 4.6 |
| (d1) | Dynasylan 6490 | 20 | 23.1 | — |
| (d2) | KR-511 | — | — | 33.3 |
| Silane | KBM-1003 | — | — | — |
| Silane | KBM-1403 | — | — | — |
| (e) | SC2050HNJ | 300 | 230.8 | 300 |
| Catalyst | Co(acac)₂ | 0.02 | — | — |
| (f) | Nofmer BC-90 | — | — | 6.7 |

TABLE 2

| Component | | Comparative Example 1 | Comparative Example 2 | Comparative Example 3 |
|---|---|---|---|---|
| (a1) | OPE-2St-1200 | — | — | 100 |
| (a2) | OPE-2St-2200 | 100 | 100 | — |
| (a3) | SA-9000 | — | — | — |
| (b1) | B3000 | 10 | 10.1 | 15.4 |
| (b2) | Ricon100 | 10 | 10.1 | 15.4 |
| (b3) | BMI-5100 | 20 | 20.0 | — |
| (b4) | NZ-375 | 40 | 39.7 | — |
| (c) | QS-10 | 10 | 5.4 | 4.6 |
| (d1) | Dynasylan 6490 | — | — | — |
| (d2) | KR-511 | — | — | — |
| Silane | KBM-1003 | 20 | — | 23.1 |
| Silane | KBM-1403 | — | — | — |
| (e) | SC2050HNJ | 300 | 269.78 | 230.8 |
| Catalyst | Co(acac)₂ | 0.016 | 0.02 | — |
| (f) | Nofmer BC-90 | — | — | — |

TABLE 3

| Component | | Comparative Example 4 | Comparative Example 5 | Comparative Example 6 | Comparative Example 7 |
|---|---|---|---|---|---|
| (a1) | OPE-2St-1200 | 100 | — | — | — |
| (a2) | OPE-2St-2200 | — | 100 | 100 | — |
| (a3) | SA-9000 | — | — | — | 100 |
| (b1) | B3000 | 15.4 | 10 | 10 | — |
| (b2) | Ricon100 | 15.4 | 10 | 10 | 11.1 |
| (b3) | BMI-5100 | — | 20 | 20 | 22.2 |
| (b4) | NZ-375 | — | 40 | 40 | 55.6 |
| (c) | QS-10 | 3.9 | — | — | — |
| (d1) | Dynasylan 6490 | — | 20 | 20 | — |
| (d2) | KR-511 | — | — | — | — |
| Silane | KBM-1003 | — | — | — | — |
| Silane | KBM-1403 | — | — | — | 33.3 |
| (e) | SC2050HNJ | 196.3 | 300 | 100 | 333.3 |
| Catalyst | Co(acac)₂ | — | — | 0.016 | 0.03 |
| (f) | Nofmer BC-90 | — | — | — | 6.7 |

*(a1) OPE-2St-1200 (modified phenylene ether oligomer having vinylbenzyl groups at both ends thereof, number average molecular weight of 1187 g/mol, vinyl group equivalent: 590 g/eq., manufactured by Mitsubishi Gas Chemical Company Inc.)

*(a2) OPE-2St-2200 (modified phenylene ether oligomer having vinylbenzyl groups at both ends thereof, number average molecular weight of 2250 g/mol, vinyl group equivalent: 1189 g/eq., manufactured by Mitsubishi Gas Chemical Company Inc.)

*(a3) SA-9000 (modified phenylene ether oligomer having methacryl groups at both ends thereof, number average molecular weight of 2300 g/mol, vinyl group equivalent: 1150 g/eq., manufactured by Sabic Innovative Plastics)

*(b1) B3000 (1,2-vinyl polybutadiene liquid resin, manufactured by Nippon Soda Ltd.)

*(b2) Ricon100 (liquid SBR polymer, manufactured by Cray Valley, Tg–22° C., number average molecular weight of 4500 g/mol, styrene content: 25%)

*(b3) BMI-5100 (bismaleimide, manufactured by Daiwa kasei Industry Co. Ltd., CAS #105391-33-1)

*(b4) NZ-375 (dicyclopentadiene-containing cyanate ester, manufactured by Nanokor)

*(c) QS-10 (1,4-naphthoquinone, manufactured by KAWASAKI KASEI CHEMICALS LTD.)

*(d1) Dynasylan 6490 (methoxy-functionalized vinyl siloxane oligomer, manufactured by Evonik Degussa GmbH)

*(d2) KR-511 (methoxy-functionalized vinyl/phenyl siloxane oligomer, manufactured by Shin-Etsu Silicone)
*(silane) KBM-1003 (vinyltrimethoxysilane, $(CH_3O)_3SiCH=CH_2$, manufactured by Shin-Etsu Silicone)
*(silane) KBM-1403 (p-styryltrimethoxysilane, $(CH_3O)_3SiC_6H_4CH=CH_2$, manufactured by Shin-Etsu Silicone)
*(e) SC2050HNJ (vinyltrimethoxysilane-treated slurry type microsilica, average particle size of 0.5 μm, manufactured by Admatechs)
*(f) Nofmer BC-90 (2,3-dimethyl-2,3-diphenylbutane, non-polar free radical generator, manufactured by NOF Corporation)

Experimental Example

Physical properties of the prepregs and the copper clad laminates obtained in the examples and comparative examples were measured by the following methods, and the results are shown in the following Tables 4 to 6.
(1) Dielectric Constant (Dk @1 GHz) and Dissipation Factor (Df @1 GHz)
After removing the copper foils of the copper clad laminates obtained in the examples and comparative examples by etching, the dielectric constant and dissipation factor were measured at a frequency of 1 GHz using a relative permittivity measuring device (Split Post Dielectric Resonator, Agilent).
(2) Resin Flow (R/F, %)
In accordance with a test method of IPC-TM-650(2.3.17), R/F in each of the prepregs was measured using a cover press.
(3) Weight Loss of Prepreg (W/L, wt %, −250° C.)
Weight loss of each of the prepregs obtained in the examples and comparative examples was measured using TGA (Q500, TA INSTRUMENT) under a nitrogen atmosphere while increasing the temperature to 250° C. at 3° C./min.
(4) Adhesive Strength for Copper Foil (peel strength, P/S, kgf/cm)
In accordance with a test method of IPC-TM-650 2.4.8, the time at which each of the copper foils of the copper clad laminates obtained in the examples and comparative examples was peeled off by lifting the copper foil in a 90° direction was measured and evaluated.
(5) Solder Floating (S/F, 288° C.)
In accordance with a test method of IPC-TM-650 2.4.13, each of the copper clad laminates obtained in the examples and comparative examples was floated on solder at 288° C., and the time at which delamination occurred between the copper foil and an insulating layer or between the insulating layer and insulating layer was measured.
(6) Filling of Circuit Pattern (C/F)
Each of the prepregs obtained in the examples and comparative examples was laminated on both sides of a printed circuit board having a circuit pattern height of 10 μm and a remaining copper ratio of 60%, and a copper foil (thickness of 12 μm, manufactured by Mitsui) was laminated on both sides, and cured at 230° C. under a pressure of 35 kg/cm² for 140 minutes to evaluate filling of circuit pattern. When no void or delamination occurred, it was evaluated as 'O', and when void or delamination occurred, it was evaluated as 'X'.

TABLE 4

|  | Example 1 | Example 2 | Example 3 |
|---|---|---|---|
| CTE | 10.1 | 12.2 | 11.5 |
| Dk @1 GHz | 3.40 | 3.38 | 3.32 |

TABLE 4-continued

|  | Example 1 | Example 2 | Example 3 |
|---|---|---|---|
| Df @1 GHz | 0.0030 | 0.0027 | 0.0029 |
| R/F (%) | 13 | 11 | 10 |
| W/L (wt %) | 0.60 | 0.80 | 0.75 |
| P/S (kgf/cm) | 0.73 | 0.72 | 0.65 |
| S/F (min) | >5 | >5 | >5 |
| C/F | O | O | O |

TABLE 5

|  | Comparative Example 1 | Comparative Example 2 | Comparative Example 3 |
|---|---|---|---|
| CTE | 10.3 | 11.1 | 10.8 |
| Dk @1 GHz | 3.51 | 3.39 | 3.5 |
| Df @1 GHz | 0.0036 | 0.0032 | 0.0037 |
| R/F (%) | 14 | 10 | 12 |
| W/L (wt %) | 4.70 | 0.50 | 4.10 |
| P/S (kgf/cm) | 0.35 | 0.51 | 0.36 |
| S/F (min) | <1 | >5 | <1 |
| C/F | X (delamination) | O | X (delamination) |

TABLE 6

|  | Comparative Example 4 | Comparative Example 5 | Comparative Example 6 | Comparative Example 7 |
|---|---|---|---|---|
| CTE | 11.9 | 10.5 | 18.3 | 11.5 |
| Dk @1 GHz | 3.38 | 3.4 | 3.1 | 3.32 |
| Df @1 GHz | 0.0028 | 0.003 | 0.0035 | 0.0032 |
| R/F (%) | 9 | 1.5 | 17.0 | 10 |
| W/L (wt %) | 0.70 | 0.50 | 1.20 | 4.60 |
| P/S (kgf/cm) | 0.47 | 0.62 | 0.62 | 0.37 |
| S/F (min) | >5 | >5 | >5 | <1 |
| C/F | O | X (void) | O | X (delamination) |

Referring to Tables 4 to 6, it was confirmed that the prepregs or the copper clad laminates of the examples showed a weight loss of less than 1% by weight while having a low dielectric constant of 3.40 or less, and a low dissipation factor of 0.0030 or less, showed adhesive strength for the copper foil of about double that of Comparative Example 1, and showed excellent filling of a circuit pattern.

By contrast, it was confirmed that most of the prepregs or the copper clad laminates of the comparative examples showed low adhesive strength for the copper foil. Particularly, it was confirmed that Comparative Example 1, Comparative Example 3, and Comparative Example 7 showed high weight loss of 4% by weight or more to generate much out-gas, and filling of a circuit pattern was poor due to occurrence of delamination.

The invention claimed is:
1. A resin composition, comprising:
(a) a modified phenylene ether oligomer or a modified poly(phenylene ether) having ethylenically unsaturated groups at both ends thereof;
(b) one or more compounds selected from the group consisting of polybutadiene having 1,2-vinyl groups in a molecule, a styrene-butadiene copolymer, a bismaleimide resin, and a cyanate ester resin;
(c) a quinone compound;
(d) an alkoxysilane oligomer; and
(e) an inorganic filler.

2. The resin composition of claim 1, comprising, with respect to 100 parts by weight of the component (a):
   10 to 100 parts by weight of the component (b);
   1 to 20 parts by weight of the component (c);
   10 to 100 parts by weight of the component (d); and
   200 to 1000 parts by weight of the component (e).

3. The resin composition of claim 1, wherein the ethylenically unsaturated groups of component (a) comprise: ethenyl groups, allyl groups, methallyl groups, propenyl groups, butenyl groups, hexenyl groups, octenyl groups, cyclopentenyl groups, cyclohexenyl groups, acryl groups, methacryl groups, vinylbenzyl groups, or vinylnaphthyl groups.

4. The resin composition of claim 1, wherein the component (b) includes the polybutadiene having 1,2-vinyl groups in a molecule and the styrene-butadiene copolymer.

5. The resin composition of claim 1, wherein the component (c) includes one or more compounds selected from the group consisting of 1,4-naphthoquinone and 1,4-benzoquinone.

6. The resin composition of claim 1, wherein the component (d) includes a repeating unit represented by the following Chemical Formula 1:

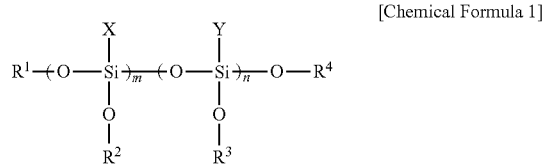

[Chemical Formula 1]

wherein, in Chemical Formula 1, X and Y are each independently alkenyl, methacryl, acryl, phenyl, methyl, or epoxy,
$R^1$ to $R^4$ are each independently methyl or ethyl, and
m and n are each independently an integer of 1 or more.

7. The resin composition of claim 1, wherein the component (d) is one or more compounds selected from the group consisting of a methoxy functional vinyl siloxane oligomer, an ethoxy functional vinyl siloxane oligomer, and a methoxy functional vinyl/phenyl oligomer.

8. The resin composition of claim 1, further comprising a non-polar free radical generator.

9. The resin composition of claim 8, wherein the non-polar free radical generator is one or more compounds selected from the group consisting of 2,3-dimethyl-2,3-diphenylbutane, 3,4-dimethyl-3,4-diphenylhexane, 4,5-dimethyl-4,5-diphenyloctane, 3,4-diethyl-3,4-diphenylhexane, 4,5-diethyl-4,5-diphenyloctane, 2,3-dimethyl-2,3-di-p-tolylbutane, and 3,4-dimethyl-3,4-di-p-tolylhexane.

10. A prepreg obtained by impregnating a fabric substrate with the resin composition of claim 1.

11. A metal clad laminate comprising:
    the prepreg of claim 10; and
    a metal foil integrated with the prepreg by heating and pressurizing.

12. The resin composition of claim 1, wherein the component (b) includes the styrene-butadiene copolymer, the bismaleimide resin, and the cyanate ester resin.

13. The resin composition of claim 1, wherein the component (b) includes the polybutadiene having 1,2-vinyl groups in the molecule, the styrene-butadiene copolymer, the bismaleimide resin, and the cyanate ester resin.

* * * * *